(12) United States Patent
Harada et al.

(10) Patent No.: US 6,525,376 B1
(45) Date of Patent: *Feb. 25, 2003

(54) HIGH WITHSTAND VOLTAGE INSULATED GATE N-CHANNEL FIELD EFFECT TRANSISTOR

(75) Inventors: Hirofumi Harada, Chiba (JP); Jun Osanai, Chiba (JP)

(73) Assignee: Seiko Instruments Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,670

(22) Filed: Jan. 22, 1999

(30) Foreign Application Priority Data

Jan. 26, 1998 (JP) .............................. 10-013028
Dec. 4, 1998 (JP) .............................. 10-346156

(51) Int. Cl.$^7$ ......................... H01L 29/76; H01L 29/94; H01L 23/58
(52) U.S. Cl. ....................... 257/343; 257/409; 257/492; 257/493
(58) Field of Search ................. 257/370, 343, 257/409, 492, 493, 345

(56) References Cited

U.S. PATENT DOCUMENTS 5,286,995 A * 2/1994 Malhi ........................ 257/343
5,386,136 A * 1/1995 Williams et al. ............. 257/343
5,432,370 A * 7/1995 Kitamura et al. ............ 257/409
5,998,845 A * 12/1999 Ludikhuize ................. 257/409

FOREIGN PATENT DOCUMENTS

JP 52-23277 * 2/1977 ................. 257/343

* cited by examiner

Primary Examiner—Steven Loke
(74) Attorney, Agent, or Firm—Adams & Wilks

(57) ABSTRACT

A high withstand voltage insulated gate N-channel field effect transistor has a P-type semiconductor substrate and an N-type epitaxial layer formed on the semiconductor substrate. An N-type source region having a high concentration is formed on the epitaxial layer. An N-type drain region having a high concentration is formed on the epitaxial layer and is spaced-apart from the source region. A channel forming region is disposed between the source region and the drain region. A gate insulating film is disposed over the source and drain regions and the channel forming region. A gate electrode is formed through the channel forming region and the gate insulating film. An N-type low concentration region is formed between the drain region and the channel forming region. A second insulating film is formed on the low concentration region and has a thickness greater than that of the gate insulating film. A P-type buried layer is formed in a boundary region between the semiconductor substrate and the epitaxial layer and below the source region, the drain region, the channel forming region, and the second insulating film. A P-type well layer is formed in a region under the source region and the channel forming region and is formed in a part of a region under the second insulating film so as to surround the drain region.

4 Claims, 9 Drawing Sheets

HIGH WITHSTAND VOLTAGE INSULATED GATE N-CHANNEL FIELD EFFECT TRANSISTOR

BACKGROUND OF THE INVENTION

The present invention relates to a high withstand voltage insulated gate N-channel field effect transistor having a withstand voltage of 15 V or more at a semiconductor substrate which can incorporate a Bipolar or CMOS and on which an epitaxial layer is formed, and to a semiconductor device including this high withstand voltage insulated gate N-channel field effect transistor.

FIG. 5 is a sectional view of an example of BiCMOS integrated circuits, which is manufactured by using a P-type semiconductor substrate 1 and through an N-type epitaxial step. An N-channel insulated gate field effect transistor 101 is formed in such a manner that a P-type well layer 4 is formed in an N-type epitaxial layer 2 and it is formed in this region, and a P-type insulated gate field effect transistor 102 is formed in a region of the N-type epitaxial layer 2. An NPN vertical bipolar transistor 103 is manufactured in such a manner that a P-type base region 15 and an N-type sinker 14 are formed in the N-type epitaxial layer 2 on an N-type buried layer 13. Separation of each element, especially separation between the insulated gate field effect transistor and the bipolar transistor can be made in such a manner that a P-type buried layer 3 and the P-type well layer 4 are made to be diffused from the upside and downside of the N-type epitaxial layer and are brought into contact with each other.

Although the thickness of the N-type epitaxial layer depends on the performance of an objective integrated circuit, as an example, when the withstand voltage of the NPN vertical bipolar transistor is set at 15 V or more, it is appropriate that the thickness is made 4 μm or more. With respect to the N-type sinker 14, for the purpose of lowering collector resistance and lowering h fe of a parasitic bipolar, it is appropriate that the concentration is selected from the condition of $5\times10^{17}$ to $1\times10^{19}/cm^3$ and the depth is selected from the condition of 3 to 5 μm.

FIG. 2 is a sectional view of an example of a high withstand voltage insulated gate N-channel field effect transistors used at a semiconductor substrate including an epitaxial layer in a BiCMOS integrated circuit.

Reference numeral 1 denotes a semiconductor substrate, and a P-type semiconductor substrate is generally used. An N-type epitaxial layer 2 of $1\times10^{14}$ to $1\times10^{16}/cm^3$ is formed on this P-type semiconductor substrate, and elements are formed therein. In the case of the N-channel insulated gate field effect transistor, a P-type well layer 4 and as the need arises, a P-type buried layer 3 are in this P-type region. Reference numerals 5 and 6 denote a source region and a drain region of the insulated gate field effect transistor, in which P or As is implanted to make the concentration as high as $1\times10^{20}/cm^3$ or more. Although a gate electrode 8 is formed over a channel forming region 11 through a gate insulating film 7, and an N-type low concentration region 9 of $1\times10^{16}$ to $1\times10^{18}/cm^3$ is formed between the drain region 6 and the channel forming region 11 so that a withstand voltage between the drain and source can be raised as compared with the case where this low concentration region does not exist. This is because a depletion layer at a drain side is apt to extend in this low concentration region as compared with a general insulated gate field effect transistor so that there is an effect to suppress the avalanche breakdown from occurring in the junction between the drain region and the channel forming region. Although the length of this low concentration region depends on a desired withstand voltage, it is appropriate that the length is set between 1.5 μm and 3 μm in the case where the withstand voltage is from 15 V to 40 V. When the insulating film 10 on the N-type low concentration region is made thicker than the gate insulating film, it is possible to avoid occurrence of a high electric field between the gate and drain, and it is possible to prevent a leak and breakdown due to this. It is desirable that the thickness of this insulating film 10 thicker than the gate insulating film is 0.1 μm or more, and, for example, a field insulating film for separating elements may be used as the film.

However, the high withstand voltage insulated gate field effect transistor having the structure of FIG. 2 has a low ESD (Electric Static Discharge) strength and has a defect that when a drain terminal is connected to an external pad, junction breakdown is apt to occur in the N-type low concentration region by static electricity entering the drain terminal from the outside. In order to prevent the breakdown by the static electricity, for example, there is a method in which a specific protective element is provided at a wiring line communicating with a pad in a circuit. However, by setting this protective element, the area of a semiconductor integrated circuit is increased, and the cost is increased. For the purpose of improving the ESD strength of the high withstand voltage insulated gate field effect transistor without using the protective element, for example, there is a method in which a deep N-type diffusion region 12 is formed around the center of a high concentration drain region as shown in FIG. 4. However, this method also increases the cost due to the increase of steps since a mask step and a diffusion step must be newly added to form the N-type diffusion region. The higher the concentration of the N-type diffusion layer 12 is, and the deeper the depth from the surface of the N-type epitaxial layer 2 is, the better the ESD strength can be increased. For example, in the case of HBM (H man Body Model), in order to obtain an ESD strength of 2 kV or more, it is appropriate that the concentration of the N-type diffusion layer is $1\times10^{16}/cm^3$ or more and the depth is 1.5 μm or more.

As described above, in the high withstand voltage insulated gate field effect transistor, for the purpose of making the high withstand voltage compatible with the high ESD strength, it is impossible to avoid the increase of steps for one mask.

Then, for the purpose of solving such a problem of the prior art, an object of the present invention is to make the high withstand voltage and high ESD strength of a high withstand voltage insulated gate field effect transistor compatible with each other without using a protective element and without increasing lubrication steps.

SUMMARY OF THE INVENTION

In order to solve the above problem, according to the present invention, a high withstand voltage insulated gate N-channel field effect transistor is characterized by comprising: a source region and a drain region, each having an N-type and high concentration, formed on an N-type epitaxial layer formed on a P-type semiconductor substrate with an interval; a channel forming region between the source region and the drain region; a gate electrode formed through the channel forming region and a gate insulating film; an N-type low concentration region formed between the drain region and the channel forming region; an insulating film formed on the low concentration region and is thicker than the gate insulating film; a P-type buried-layer formed in a region, which is a boundary between the semiconductor substrate and the epitaxial layer, including the source region, the drain region, the channel forming region, and a region under the insulating film thicker than the gate insulating film; and a P-type well layer in a region including the source region, the channel forming region, and a part of the region under the insulating film thicker than the gate insulating film, and surrounding the drain region.

Further, the high withstand voltage insulated gate N-channel field effect transistor of the above-described structure is characterized in that the P-type well layer and the P-type buried layer are formed in a region including the source region, the channel forming region, and a part of the region under the insulating film thicker than the gate insulating film, and surrounding the drain region.

Further, the high withstand voltage insulated gate N-channel field effect transistor of the above-described structure, comprising a P-type buried layer formed in a region, which is a boundary between the semiconductor substrate and the epitaxial layer, including the source region, the channel forming region, and a part of the region under the insulating film thicker than the gate insulating film, and surrounding the drain region; and a P-type well layer formed in a region including the source region, the drain region, the channel forming region, and a region under the insulating film thicker than the gate insulating film, is characterized in that an N-type diffusion region with a concentration of $5 \times 10^{17}$ to $1 \times 10^{19}/cm^3$ and a depth of 3 to 5 μm is formed in a region including the drain region and a part of the region under the insulating film thicker than the gate insulating film.

Further, the high withstand voltage insulated gate N-channel field effect transistor of the above-described structure, comprising: an insulating film that is thicker than the gate insulating film, and formed between the source region and the gate insulating film, and between the drain region and the gate insulating film; an N-type low concentration region under the insulating film thicker than the gate insulating film; and a P-type buried layer in a region, which is a boundary between the semiconductor substrate and the epitaxial layer, including the source region, the drain region, a region under the gate insulating film; and a region under the insulating film thicker than the gate insulating film, is characterized in that the P-type well layer is formed, apart from the ends of the source region side and the drain region side of the gate insulating film, in a part of the region under the gate insulating film.

Further, the high withstand voltage insulated gate N-channel field effect transistor of the above-described structure, is characterized in that the P-type well layer and the P-type buried layer are formed, apart from the ends of the source region side and the drain region side, in a part of the region under the gate insulating film.

Further, the high withstand voltage insulated gate N-channel field effect transistor of the above-described structure is characterized in that the depth of the N-type region comprising an N-type epitaxial layer surrounded by the P-type buried layer and the P-type well layer, is not less than 2.5 μm.

Further, the high withstand voltage insulated gate N-channel field effect transistor of the above-described structure is characterized in that the depth of an N-type region comprising the N-type epitaxial layer surrounded by the P-type semiconductor substrate, the P-type buried layer, and the P-type well layer, is not less than 2.5 μm.

Further, the high withstand voltage insulated gate N-channel field effect transistor of the above-described structure is characterized in that the concentration of the N-type low concentration region is not less than $3 \times 10^{17}/cm^3$, distances between the P-type well layer formed in a part of the region under the gate insulating film and respective ends of the gate insulating film on the source region side and on the drain region side are equal to each other, and the length thereof is 2.2 to 4.2 μm each.

Further, the high withstand voltage insulated gate N-channel field effect transistor of the above-described structure is characterized in that the concentration of the N-type low concentration region is not less than $3 \times 10^{17}/cm^3$, distances between the P-type well layer and the P-type buried layer formed in a part of the region under the gate insulating film and respective ends of the gate insulating film on the source region side and on the drain region side are equal to each other, and the length thereof is 2.2 to 4.2 μm each.

DETAILED DESCRIPTION OF THE PREFERRED EMBODIMENTS

The embodiment mode for carrying out the present invention will be described below with reference to the drawings.

Figure 5:
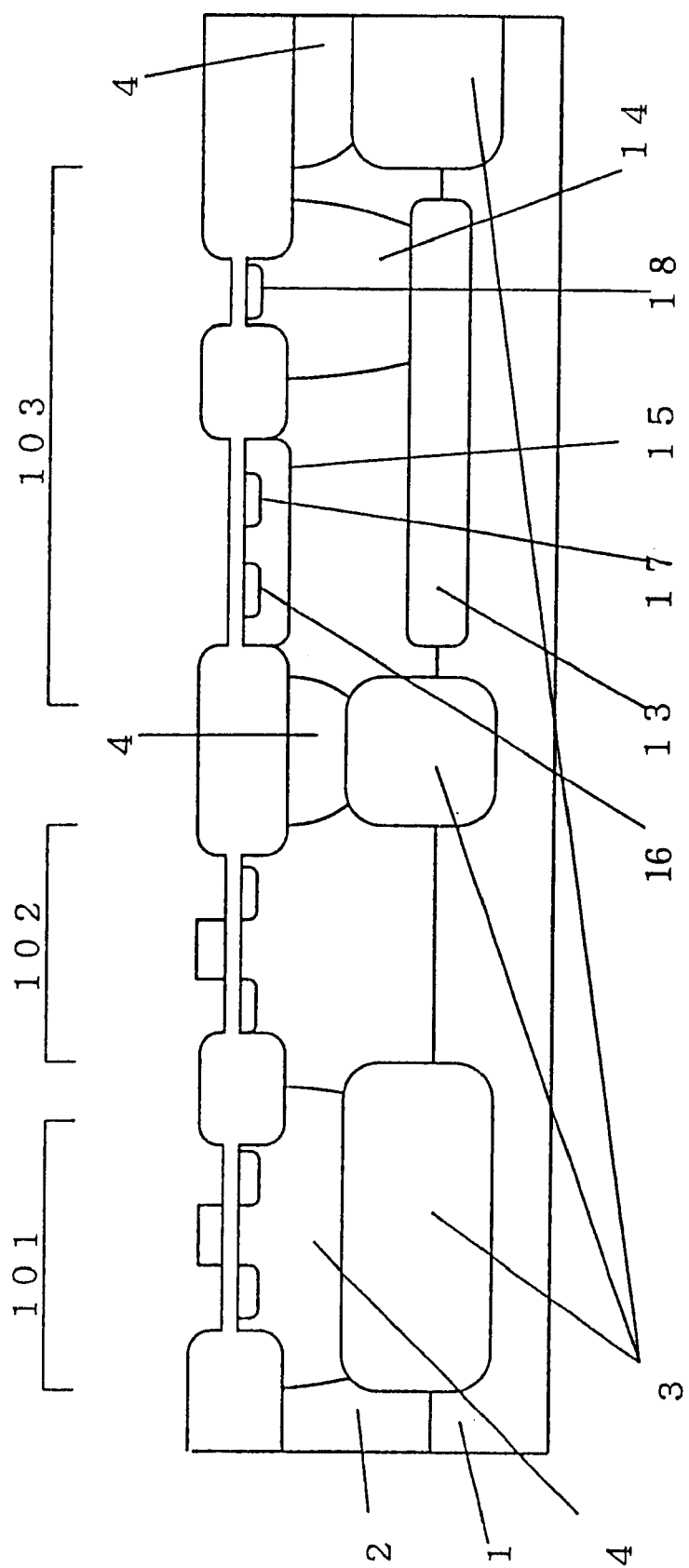
FIG. 5 is a schematic sectional view of a BiCMOS integrated circuit including an insulated gate field effect transistor and a bipolar transistor.

The present invention, relates to a high withstand voltage insulated gate N-channel field effect transistor used in a BiCMOS integrated circuit as shown in the sectional view of FIG. 5. First of all, manufacturing steps of the high withstand voltage insulated gate field effect transistor of the present invention will be described with reference to FIG. 8.

Figure 8A:
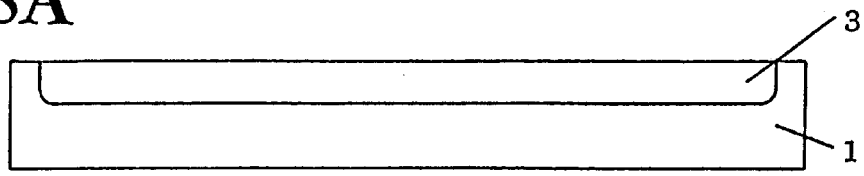
FIGS. 8A–8E are sectional views; showing a manufacturing method of a high withstand voltage insulated gate N-channel field effect transistor of the present invention.

Firstly, a P-type semiconductor substrate 1 is prepared, and an impurity is introduced in a part of this surface. This impurity implantation region is a region that subsequently becomes a buried layer, and in the case where an NPN vertical bipolar transistor is manufactured, an N-type impurity, such as SB or As, is implanted * in its element region to form an N-type buried layer, and B is implanted in an element separation region, an element region of the high withstand voltage insulated gate N-channel field effect transistor, or the like to form a P-type buried layer 3 (FIG. 8A). The implantation is carried out by, for example, an ion implantation method. Although the amount of implantation depends on the characteristics of an element to be manufactured, in the case where B is ion implanted, it is desirable that the amount is in the order of $10^{14}/cm^2$ or less, especially to suppress a defect.

Figure 8B:
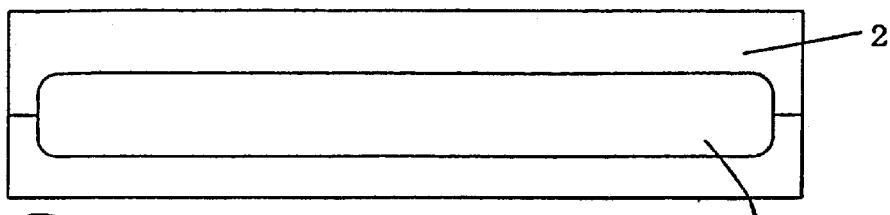

Next, an N-type epitaxial layer 2 is formed on the P-type semiconductor substrate. The film thickness and concentration are changed according to the performance of an element or circuit to be manufactured. At this time, the buried layer formed on the surface of the P-type semiconductor substrate diffuses upward in the N-type epitaxial by thermal diffusion and auto doping during the epitaxial growth (FIG. 8B).

Figure 8C:
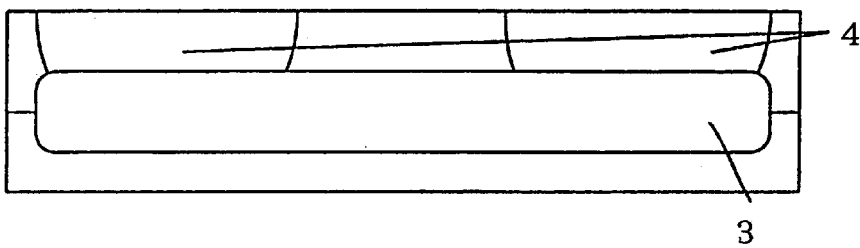

Next, in order to form a P-type well layer 4 from the surface of the N-type epitaxial layer, B is implanted and is diffused. This P-type well layer is formed in an element region of an N-channel insulated gate field effect transistor, a PNP vertical bipolar transistor, or the like or an element separating region. Since the element separation is generally carried out by bringing the P-type well layer and the P-type buried layer into contact with each other from above and below, it is necessary to make process design by adjusting a heat treatment while taking the impurity implantation amount of the P-type buried layer and the P-type well layer, the influence of the previously described heat diffusion, and the like into consideration. In the high withstand voltage insulated gate N-channel field effect transistor of the present invention, although the P-type well layer is formed in a region where a channel is formed, the P-type well layer is not purposely formed in a region where a high concentration drain region is formed (FIG. 8C). In the case where the NPN vertical bipolar transistor is integrated at the same time, an N+ sinker is generally formed in a collector portion before or after this step.

Figure 8D:
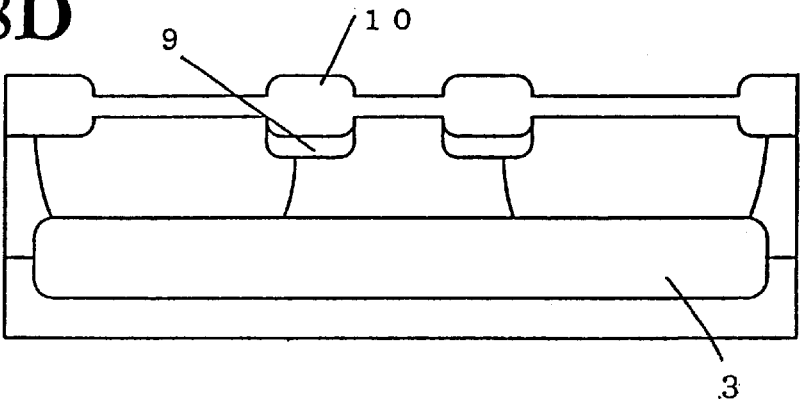

Next, an inversion preventing layer and a field insulating film 10 are formed. In the case where the high withstand voltage insulated gate field effect transistor is formed, the field insulating film 10 and the inversion preventing layer may be formed between the channel forming region and drain region at the same time. By doing so, it is possible to form an N-type low concentration region 9 peculiar to the high withstand voltage insulated gate field effect transistor, which is used to obtain a high drain withstand voltage without increasing a mask step (FIG. 8D).

Figure 8E:
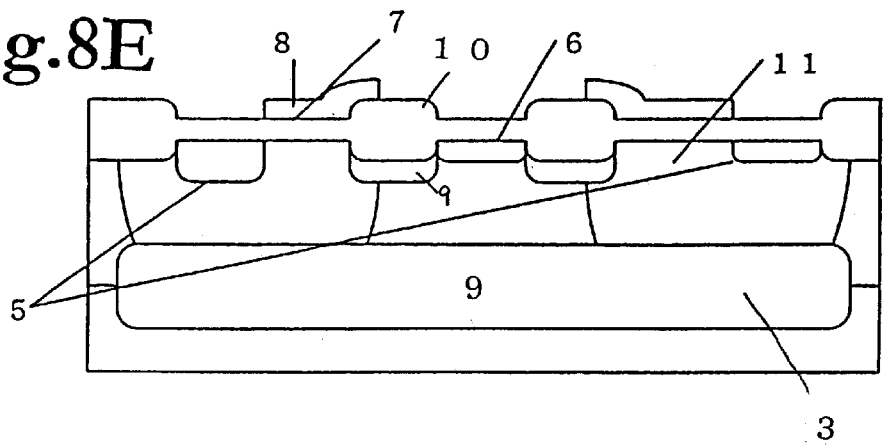

Next, a process peculiar to a general insulated gate field effect transistor, such as formation of a gate oxide film 7, a gate electrode 8, a high concentration source region 5, and a high concentration drain region 6, is carried out (FIG. 8E). In the case where the bipolar transistor is integrated at the same time, although not shown purposely, a base diffusion step and the like are also added. Thereafter, although not shown, a semiconductor element is completed through steps of an intermediate insulating film, metal wiring, passivation, and the like.

As described above, in the processes, there is no process for only the high withstand voltage insulated gate N-channel field effect transistor, but the present element can be simultaneously manufactured by a normal manufacturing process of a BiCMOS. Incidentally, as set forth before, the high withstand voltage in the present invention means that a withstand voltage between a drain and source or a drain and substrate is 15 V or more.

Figure 1A:
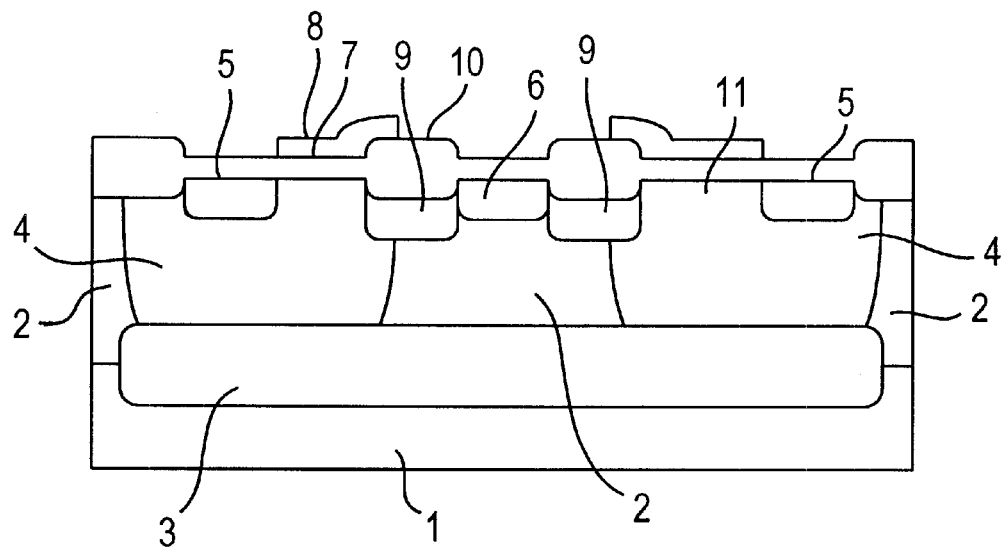
FIG. 1A is a schematic sectional view of a high withstand voltage insulated gate N-channel field effect transistor of the present invention.
Figure 1B:
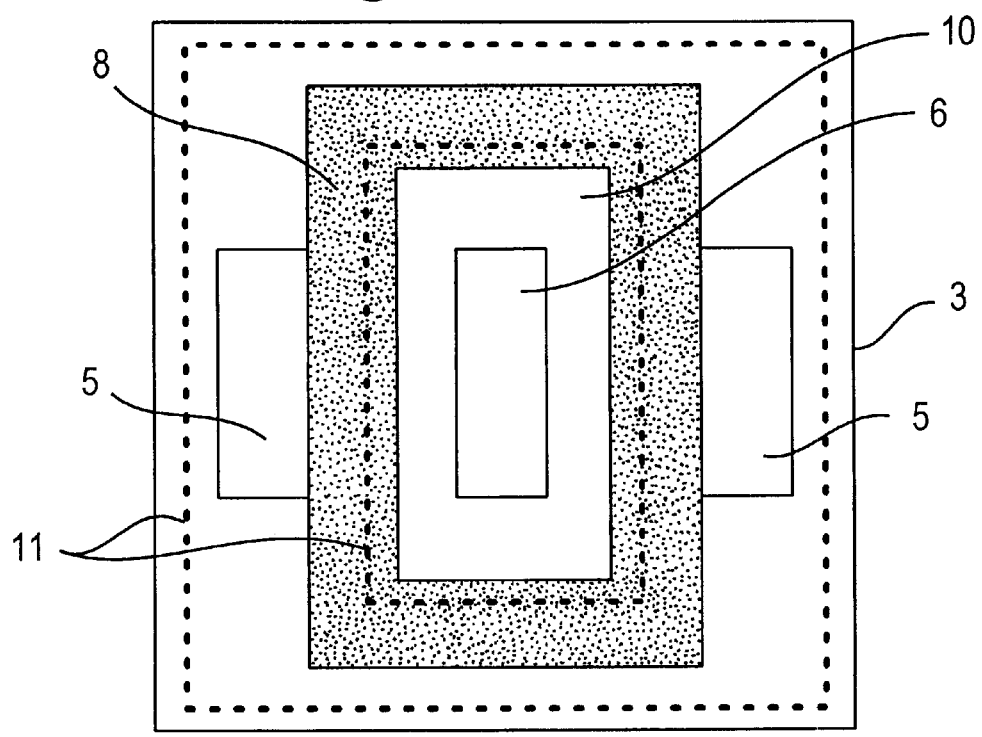
FIG. 1B is a schematic plan view of the high withstand voltage insulated gate N-channel field effect transistor of the present invention.
Figure 2:
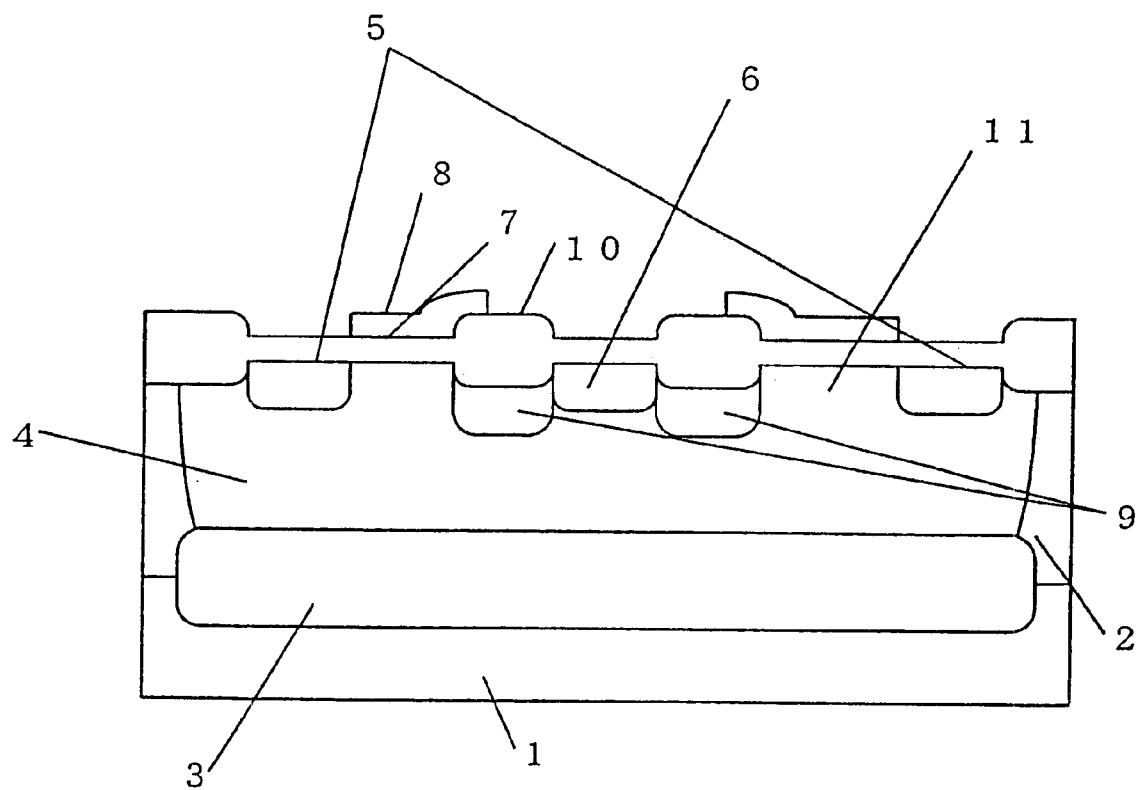
FIG. 2 is a schematic sectional view of a conventional high withstand voltage insulated gate N-channel field effect transistor.

FIG. 1A is a sectional view of a semiconductor element of the present invention, and FIG. 1B is a schematic plan view of the semiconductor element of the present invention. In the drawings, a P-type buried layer 3 covers the whole surface of the under portion of an element region of this high withstand voltage insulated gate field effect. More specifically, the P-type buried layer 3 is formed in a boundary region between a semiconductor substrate 1 and an epitaxial layer 2 and below an N-type source region 5 and a channel forming region 11 and formed in part of a region under a second insulating film 10 and a high concentration drain region 6. A P-type well layer 4 is not formed on the whole surface of the element region as in the prior art of FIG. 2, but it is formed in a region including the N-type source region 5 and a part of an N-type low concentration region 9 other than the high concentration drain region 6. The N-type low concentration region 9 is formed between the drain region 6 and the channel forming regions 11. As shown in FIG. 1B, the P-type well layer 4 is formed inside of two dotted lines 11 of FIG. 1B so as to surround the periphery of the high withstand voltage insulated gate field effect transistor. Thus, regions which have the same potential as the drain are three regions of the drain region 6, the N-type low concentration region 9, and an N-type epitaxial layer 2 surrounded by the P-type buried layer and the P-type well layer. Other structures are the same as those of the conventional high withstand voltage insulated gate field effect transistor as shown in FIG. 2. That is, since the N-type low concentration region 9 and a thick insulating film 10 are formed between the drain region and the channel forming region, it is possible to make the withstand voltage high as compared with a general insulated gate field effect transistor.

The previously mentioned region of the N-type epitaxial layer which has the same potential as the drain region and is surrounded by the P-type well layer, is formed in such a manner that the lower portion in FIG. 1 is covered with the P-type buried layer, the side portion is surrounded by the P-type well layer, and the P-type buried layer is brought into contact with the P-type well layer, so that a drain current does not leak from the drain to other regions in the electric operation of the transistor. It is possible to make this region have the same function as the N-type diffusion region 12 of the prior art of FIG. 4. That is, as compared with the conventional structure of high withstand voltage insulated gate N-channel field effect transistor as shown in FIG. 2, the ESD strength can be improved.

Figure 4:
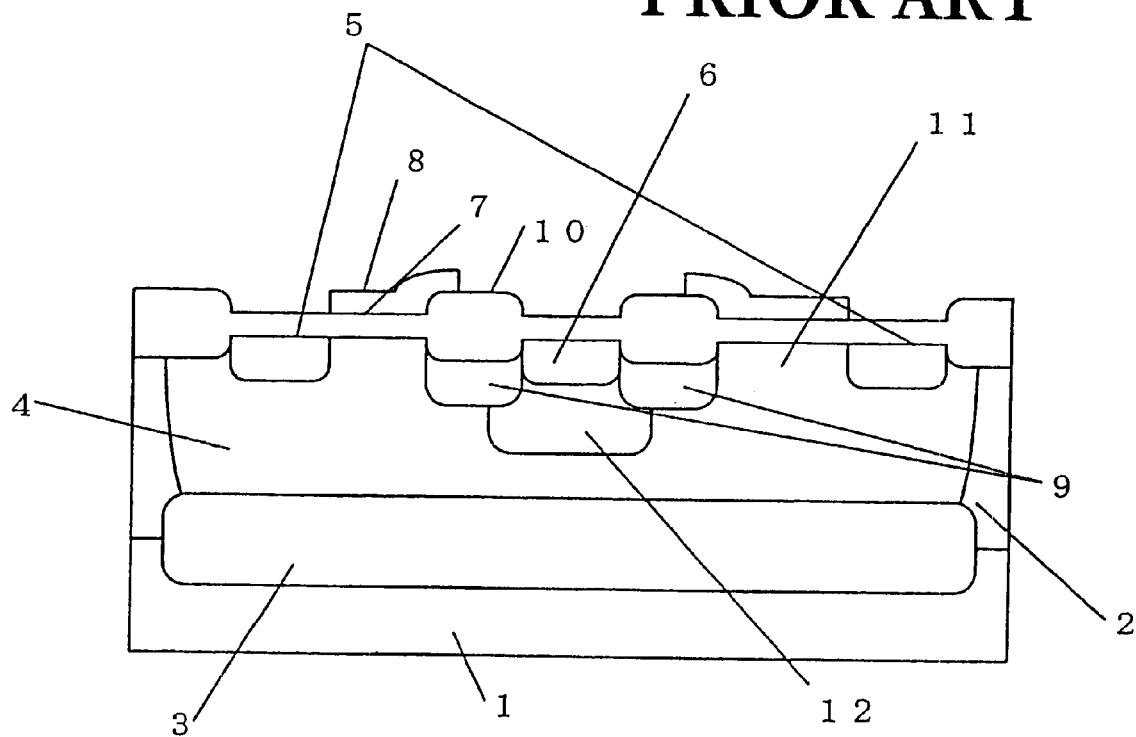
FIG. 4 is a schematic sectional view of another example of a conventional high withstand voltage insulated gate N-channel field effect transistor.

That is, without adding the step of forming the N-type diffusion region 12 in the prior art of FIG. 4, the high ESD strength as well as the high withstand voltage can be realized.

Figure 9:
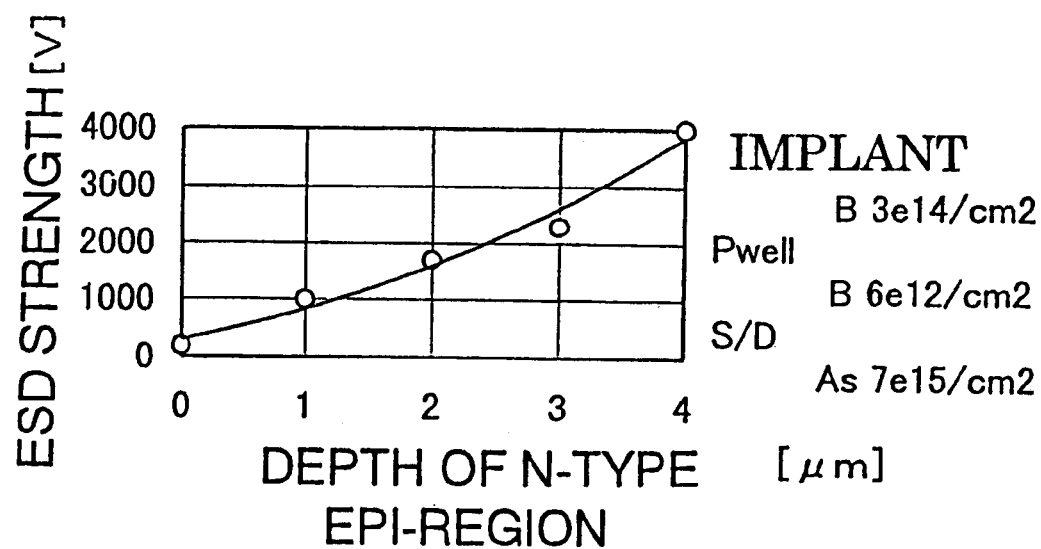
FIG. 9 is a graph showing the relation between the depth of an N-type epitaxial region and ESD strength according to a HBM in a high withstand voltage insulated gate N-channel field effect transistor of the present invention.

However, although the concentration of impurity of the region of the N-type epitaxial layer under the high concentration drain region is $1\times10^{14}$ to $1\times10^{16}/cm^3$ and is determined by epitaxial conditions, it is desirable as described in the prior art that the concentration of this region is $1\times10^{16}/cm^3$ or more to keep the ESD strength at high. However, the characteristics of other elements are also affected with the concentration of the N-type epitaxial layer, and it is difficult to simply change. Then, for the purpose of keeping the ESD strength high, it is appropriate that the depth of the region of the N-type epitaxial layer is so deep as to compensate the lower impurity concentration than the prior art. In the case where the N-type diffusion layer 12 is used as in the prior art of FIG. 4, it has been set forth that the depth of the N-type diffusion layer is required to be at least 1.5 µm. In the case of the present invention, as is understood from the experimental result of FIG. 9, when the depth of the N-type epitaxial layer is made 2.5 µm, an ESD strength of 2 kV can be obtained in the HBM. For example, the above condition can be satisfied by such a process that the film thickness of the epitaxial layer becomes 5 µm and the upper diffusion of the P-type buried layer becomes 2.5 µm. In the method of FIG. 1 of the present invention, for the purpose of securing the region of the N-type epitaxial layer just under the drain, the film thickness when the N-type epitaxial layer is formed is required preferably to be at least 3.5 to 5 µm.

In FIG. 1, although such a structure is made that the high concentration drain region is made the center, the gate electrode is formed so as to surround it, and the source regions are disposed at both sides of the drain region, it is not necessarily required that the source regions are disposed at both sides of the drain region, and although not shown, there is no problem even if such a structure is adopted that the source region is disposed at either one side of the high concentration drain region or surrounds the entire periphery. Also in that case, the structure of a P-type well layer is the same in that it includes a source region and an N-type low concentration region other than a high concentration drain region, and is formed so as to surround the high concentration drain region.

Figure 3:
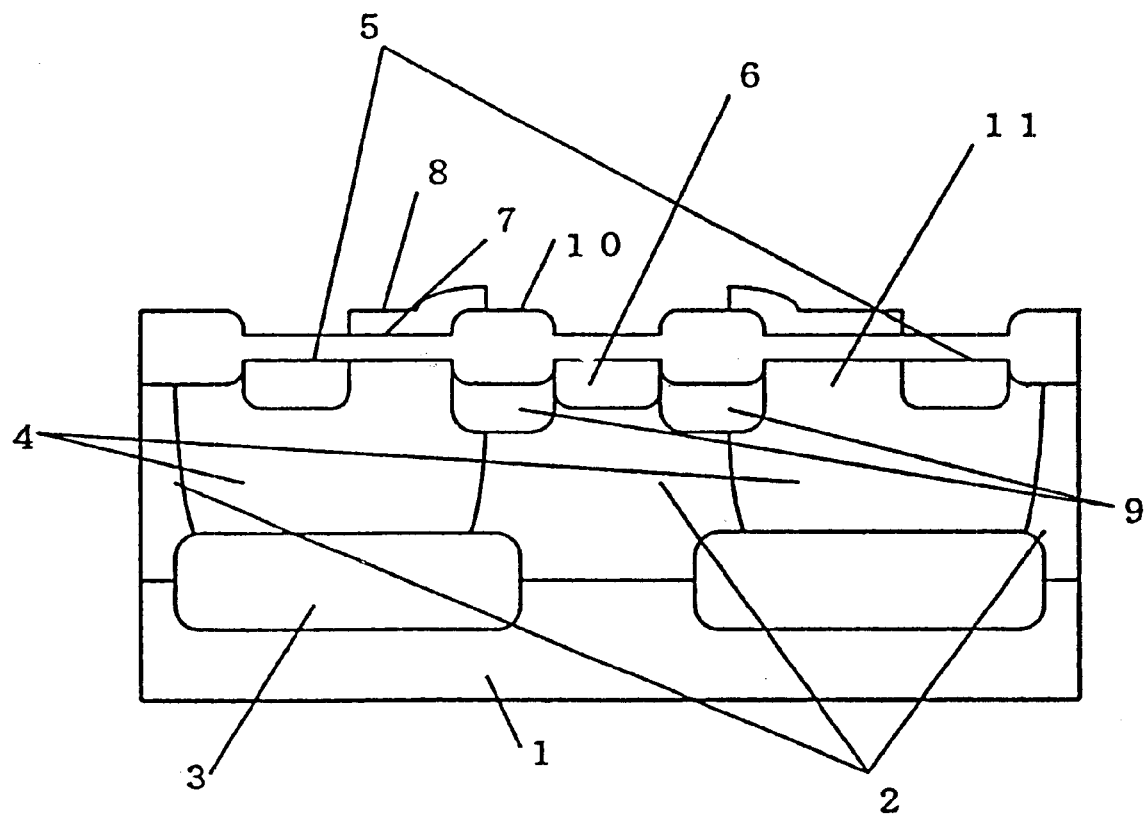
FIG. 3 is a schematic sectional view of another embodiment of a high withstand voltage insulated gate N-channel field effect transistor of the present invention.

When an integrated circuit is constructed by BiCMOSs, in A the case where the N-type epitaxial layer is made 4 µm or less in accordance with the request from the performance of a bipolar transistor and the like, especially by a structure of FIG. 3, both high withstand voltage and high ESD strength of a high withstand voltage insulated gate N-channel field effect transistor can be achieved at the same time.

In the example of FIG. 3, a P-type well layer and a P-type buried layer are formed of regions including a source region and an N-type low concentration region other than a high concentration drain region, and are formed so as to surround the high concentration drain region. The difference from the example of FIG. 1 is that while the P-type buried layer in the example of FIG. 1 is formed so as to cover the entire of one element region, the P-type buried layer in FIG. 3 is not formed just under the high concentration drain region.

In FIG. 3, with respect to the region of the N-type epitaxial layer existing under the high concentration drain region, the side thereof is surrounded by the P-type buried layer 3 and the P-type well layer 4, and the lower portion thereof is surrounded by a P-type semiconductor substrate. Since the P-type buried layer and the P-type well layer are formed so as to be in contact with each other, similarly to the case of FIG. 1, a drain current does not leak from the drain to other regions in the electric operation of the transistor. Besides, in the structure of FIG. 2, the P-type buried layer does not exist just under the drain region, in order to secure an ESD strength of 2 kv in the HBM, the film thickness of the N-type epitaxial layer may be made thin down to 2.5 µm. Thus, according to the present invention, the thickness of the N-type epitaxial layer surrounded by the P-type buried layer and the P-type well layer is at least 2.5 µm.

Figure 6:
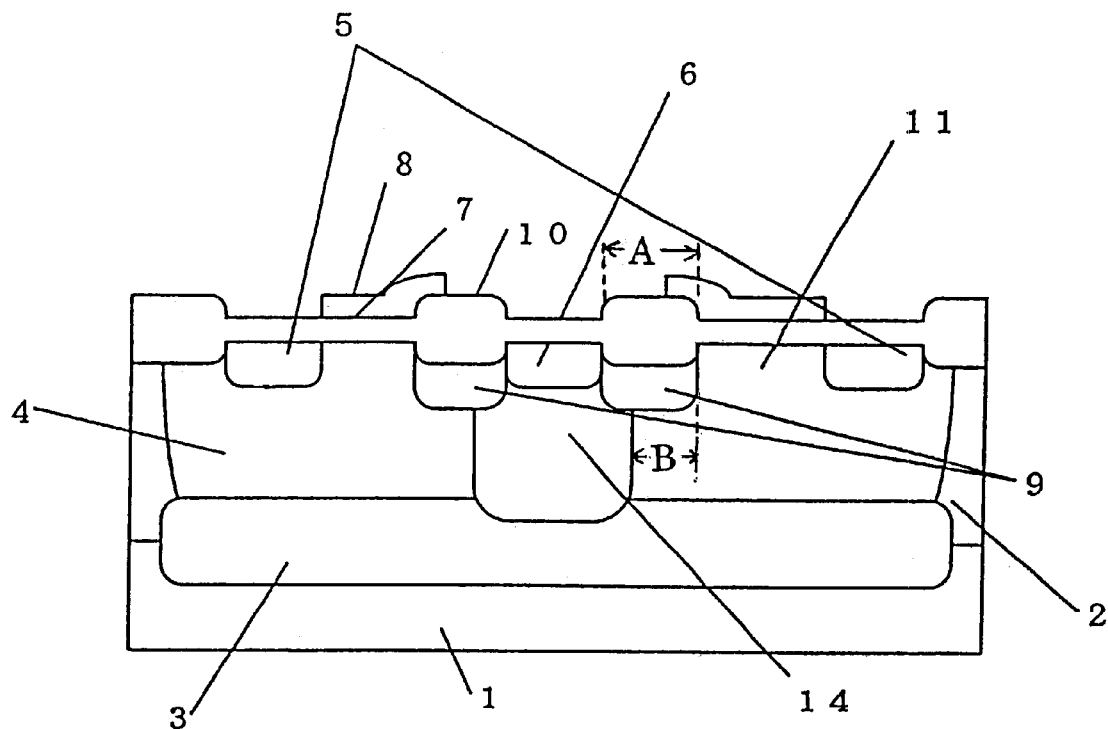
FIG. 6 is a schematic sectional view of another embodiment of a high withstand voltage insulated gate N-channel field effect transistor of the present invention.

In the case where an integrated circuit of BiCMOSs is constructed by using the high withstand voltage insulated gate N-channel field effect transistor as one of the constituent elements, as another example in which high withstand voltage and high ESD strength can be achieved at the same time without providing a protective element in the high withstand voltage insulated gate N-channel field effect transistor and without increasing steps, the N-type diffusion region 12 of the prior art of FIG. 4 may be replaced by an N-type sinker 14 used in a collector portion or the like of an NPN vertical bipolar as in FIG. 6.

Figure 7:
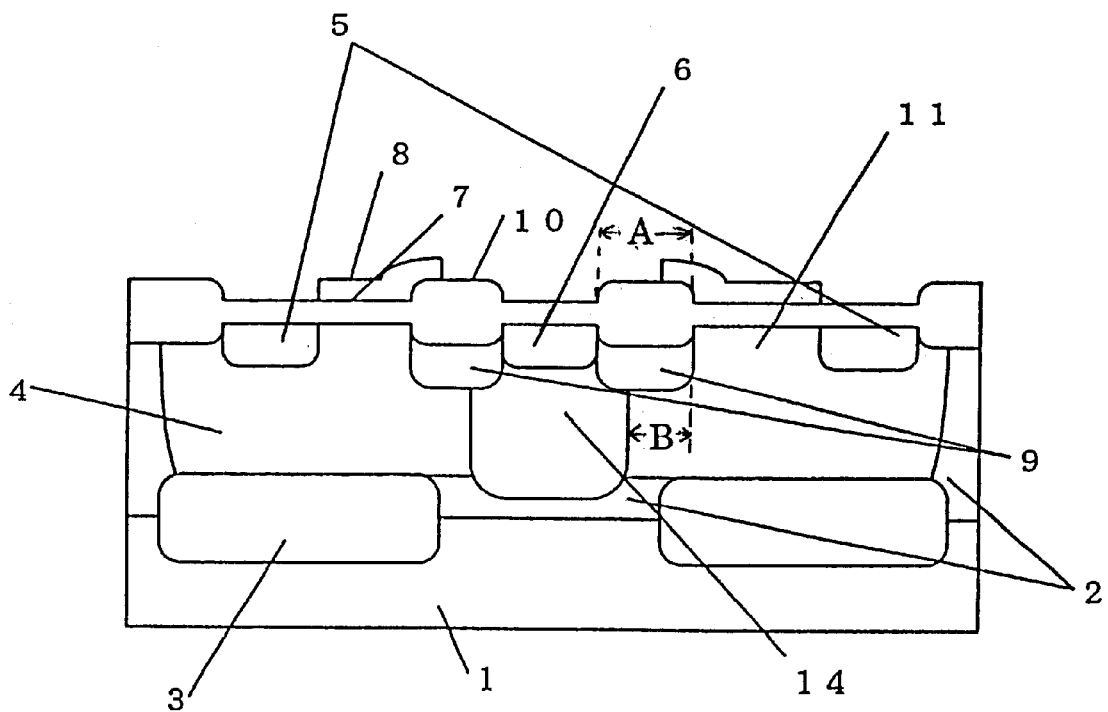
FIG. 7 is a schematic sectional view of another embodiment of a high withstand voltage insulated gate N-channel field effect transistor of the present invention.

As set forth before, since the depth of diffusion of the N-type sinker is 3 to 5 µm, it is not necessary to restrict the film thickness of the N-type epitaxial layer as in the case of FIGS. 1 or 3. Moreover, as set forth before, since the concentration is $5\times10^{17}$ to $1\times10^{19}/cm^3$, the ESD strength is also high. On the other hand, as compared with the method of the present invention of FIGS. 1 or 3, or the conventional method of FIG. 2, since the concentration is high, the withstand voltage is lowered in a transistor with the same size. In order to compensate the lowering of the withstand voltage, it is desirable that the length A of an N-type low concentration region 9 and a thick insulating film 10 is made 4 µm or more, and the distance B from a channel forming region 11 to the N-type sinker 14 is made 6 µm or more, as shown in FIGS. 6 and 7. In this case, although depending on other process conditions as well, it is possible to obtain an insulated gate N-channel field effect transistor with a withstand voltage of 40 to 50 V based on the breakdown of a P-type buried layer and the N-type sinker.

Moreover, the structure as shown in FIG. 7 may be adopted by combining the previously described structures of the present invention. As shown in FIG. 7, when an N-type sinker and an N-type epitaxial layer exist just under a high concentration drain region, the ESD strength can be set high. Moreover, when the distance between a P-type buried layer and the N-type sinker is made 3 µm or more, the withstand voltage between the P-type buried layer and the drain region can be made 50 V or more. With respect to surface breakdown occurring near a channel forming region, since the withstand voltage can be raised by prolonging the length of the N-type low concentration region, it is appropriate that this structure is adopted in the high withstand voltage insulated gate N-channel field effect transistor in which a high withstand voltage of 50 V or more is required on the whole.

Figure 10:
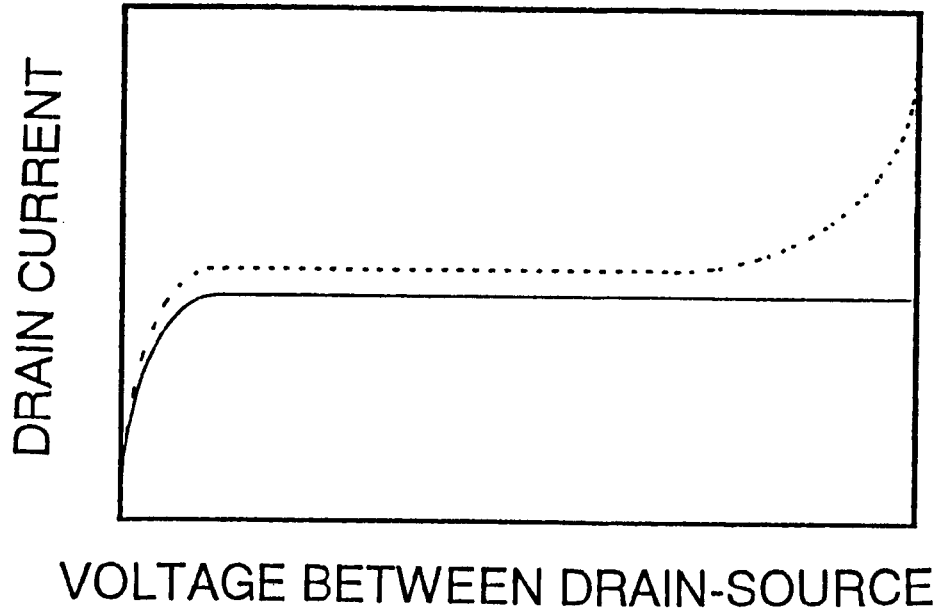
FIG. 10 is a graph showing the relation of drain current to drain voltage in an embodiment of a high withstand voltage insulated gate N-channel field effect transistor of the present invention.

By the way, in the high withstand voltage insulated gate N-channel field effect transistor of the present invention typified by FIG. 1, it has been set forth that the N-type low concentration region 9 can be used also as the inversion preventing layer in the element separating region. Since the concentration of the N-type low concentration region, that is, the concentration of the inversion preventing layer affects the element separating power and partial characteristics of a conventional insulated gate field effect transistor, the concentration can not be simply changed. In the case where this concentration is sufficiently high by the requests of the element separating power and other elements, even if the withstand voltage of the high withstand voltage insulated gate N-channel field effect transistor sufficiently satisfies the specification, there is a case where transistor characteristics are damaged. In FIG. 10, a dotted line shows static characteristics of a transistor in the case where the concentration of the N-type low concentration region is high, and when a drain voltage becomes high, collision ionization at the end of the gate insulating film in the N-type low concentration region becomes noticeable and an excessive substrate current comes to flow, which increases a drain current. It becomes impossible to neglect such a tendency of increase of the drain current when the concentration of the N-type low concentration region becomes higher than the middle of $10^{17}/cm^3$. Especially, when the gate voltage is low and the drain current is in the level of approximately several μA, the rising of the drain current starts at a drain voltage of 25 V or more, so that the property of constant current is lost. This may cause an operation of a parasitic element or hinder the operation of other elements. Although this does not become a serious problem in the case of a high driving output circuit, the precision of circuit characteristics in an analog circuit of a low current operation is degraded.

Figure 11:
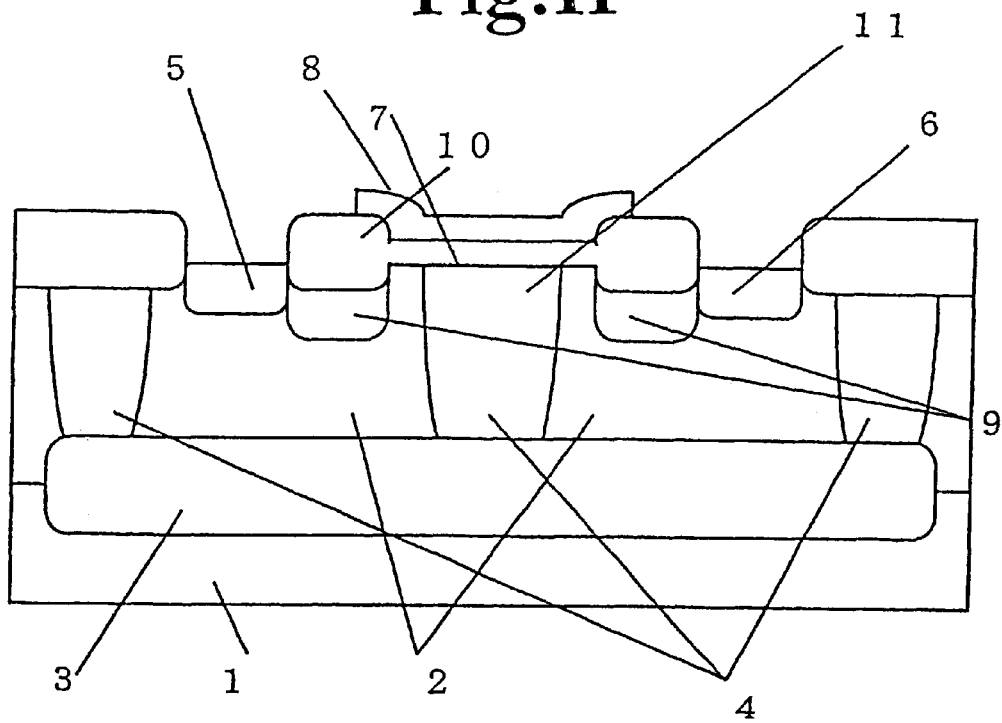
FIG. 11 is a schematic sectional view of another embodiment of a high withstand voltage insulated gate N-channel field effect transistor of the present invention.

In order to avoid this, in the present invention, as shown in FIG. 11, the P-type well layer at the drain region side is shifted to the middle under the gate insulating film while the layer does not come in contact with the N-type low concentration region, so that the depletion layer electric field at the end of the N-type low concentration region can be relieved, and the nonlinearity of the drain current at saturation by the collision ionization can be suppressed. In this case, in order to avoid that the channel length becomes irregular by the gap in alignment between the P-type well layer and the region under the gate insulating film, it is appropriate that the P-type well layer at the source region side is also shifted to the middle under the gate insulating film to make a symmetrical structure. For example, when the distance between the P-type well layer and the end of the gate insulating film is made 2.2 μm or more, characteristics as shown by the real line in FIG. 10 are obtained, and when a saturation drain current is 5 μA, the property of constant current can be secured up to 40 V of the drain voltage.

Although the constant current property of the drain current up to a high drain voltage can be kept as the distance between the P-type well layer and the end of the gate insulating film is made long, the longer this length is, the easier the extension of the depletion layer at the drain end comes to be suppressed by the gate electrode, so that the withstand voltage between the source and drain is lowered. Besides, the parasitic capacitance between the gate and drain becomes large, so that the high frequency characteristics is deteriorated. Thus, in the case where the N-channel field effect transistor with a withstand voltage of 50 V is manufactured, it is desirable that the distance between the P-type well layer and the end of the gate insulating film is 2.2 to 4.2 μm.

In another embodiment, the high withstand voltage insulated gate N-channel field effect transistor of the above-described structure is characterized in that the concentration of the N-type low concentration region is not less than $3\times10^{17}/cm^3$. As shown in FIG. 11, distances between the P-type well layer formed in a part of the region under the gate insulating film and respective ends of the gate insulating film on the source region side and on the drain region side are equal to each other. The distances preferably have a length in the range of 2.2 to 4.2 μm.

Figure 12:
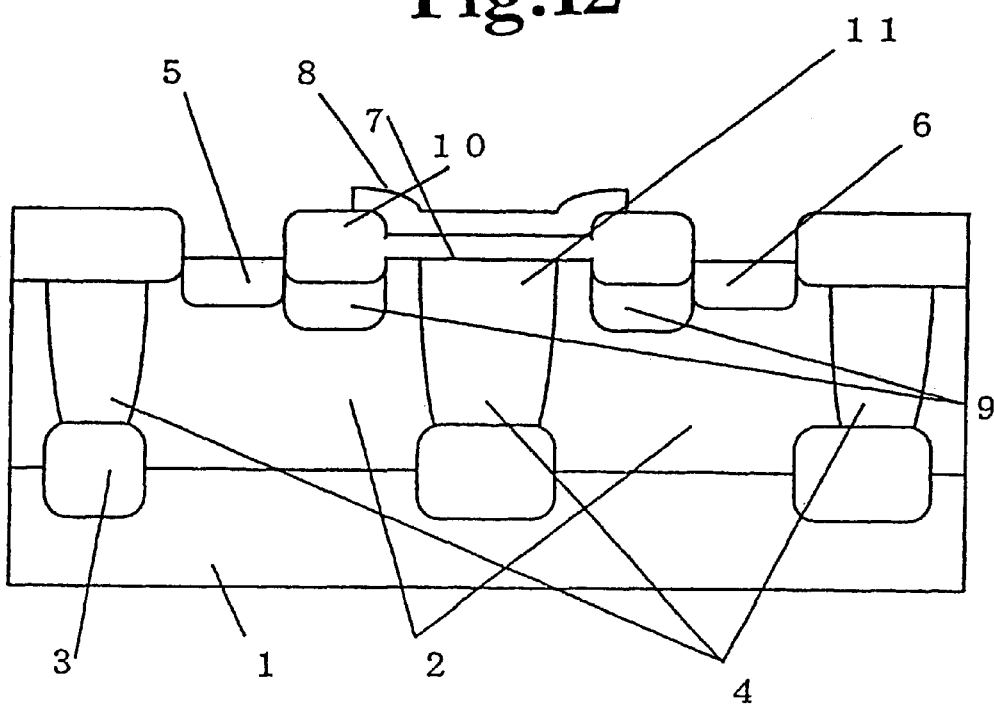
FIG. 12 is a schematic sectional view of another embodiment of a high withstand voltage insulated gate N-channel field effect transistor of the present invention.

In yet another embodiment, the high withstand voltage insulated gate N-channel field effect transistor of the above-described structure is characterized in that the concentration of the N-type low concentration region is not less than $3\times10^{17}/cm^3$. As shown in FIG. 12, distances between the P-type well layer and the P-type buried layer formed in a part of the region under the gate insulating film and respective ends of the gate insulating film on the source region side and on the drain region side are equal to each other. The distances preferably have a length in the range of 2.2 to 4.2 μm.

By adopting this structure, it is possible to obtain a high withstand voltage insulated gate N-channel field effect transistor which has high ESD strength, high withstand voltage, and low drain voltage dependency of drain current in the static characteristics of transistor operation.

In the case where the thickness of the N-type epitaxial layer is made 4 μm or less by request of other elements, since the ESD strength in the structure of FIG. 11 is lowered, if a P-type buried layer under a drain region is removed as shown in FIG. 12, high ESD strength can be maintained. As shown in FIG. 12, from the easiness of design, it does not matter if the P-type buried layer at the side of a source region is removed so as to keep symmetry.

According to the present invention, in the high withstand voltage insulated gate n-channel field effect transistor, it is possible to realize high withstand voltage and high ESD strength without the increase of steps and the increase of a circuit area.

What is claimed is:

1. A high withstand voltage insulated gate N-channel field effect transistor, comprising: a P-type semiconductor substrate; an N-type epitaxial layer formed on the semiconductor substrate; a pair of N-type source regions having a high concentration formed on the epitaxial layer; an N-type drain region having a high concentration and formed on the epitaxial layer between and spaced-apart from the source regions; a pair of channel forming regions each disposed between a respective one of the source regions and the drain region; a first insulating film comprised of a gate insulating film disposed over the source and drain regions and the channel forming regions; a gate electrode formed over the channel forming regions through the gate insulating film so as to encircle the drain region; an N-type low concentration region formed between the drain region and the channel forming regions; a second insulating film formed on the low concentration region and having a thickness greater than that of the gate insulating film; a P-type buried layer formed in a boundary region between the semiconductor substrate and the epitaxial layer and below the source regions, the drain region, the channel forming regions, and the second insulating film; and a P-type well layer formed in a region under the source regions and the channel forming regions and formed in only a part of a region under the second insulating film so as to surround the drain region.

2. A high withstand voltage insulated gate N-channel field effect transistor as claimed in claim 1; wherein the P-type well layer does not extend under the drain region.

3. A high withstand voltage insulated gate N-channel field effect transistor as claimed in claim 2; wherein a portion of the epitaxial layer is surrounded by the P-type semiconductor substrate, the P-type buried layer, and the P-type well layer and has a thickness of at least 2.5 μm.

4. A high withstand voltage insulated gate N-channel field effect transistor as claimed in claim 1; wherein a portion of the epitaxial layer is surrounded by the P-type buried layer and the P-type well layer and has a thickness of at least 2.5 μm.

* * * * *